United States Patent [19]

Zbrozek

[11] 4,305,139

[45] Dec. 8, 1981

[54] STATE DETECTION FOR STORAGE CELLS

[75] Inventor: John D. Zbrozek, Lexington, Ky.

[73] Assignee: International Business Machines Corporation, Armonk, N.Y.

[21] Appl. No.: 107,468

[22] Filed: Dec. 26, 1979

[51] Int. Cl.³ ............................................. G11C 11/40
[52] U.S. Cl. .................................... 365/203; 307/289; 365/154
[58] Field of Search ....................... 365/189, 230, 203; 307/238, 289, 262

[56] References Cited

U.S. PATENT DOCUMENTS

| | | | |
|---|---|---|---|
| 3,706,891 | 12/1972 | Donofrio et al. | 307/238 |
| 3,739,355 | 6/1973 | Radcliffe | 307/238 |
| 3,846,768 | 11/1974 | Krick | 307/238 |
| 3,967,252 | 6/1976 | Donnelly | 365/154 |
| 4,053,873 | 11/1977 | Freeman | 307/289 |
| 4,082,966 | 4/1978 | Lou | 307/362 |
| 4,087,044 | 5/1978 | Hofmann | 235/301 |
| 4,091,360 | 5/1978 | Lynch | 365/203 |
| 4,195,357 | 3/1980 | Kuo | 365/210 |

Primary Examiner—Terrell W. Fears
Attorney, Agent, or Firm—George E. Grosser

[57] ABSTRACT

For signal storage systems that interrogate a storage cell with a concomitant precharging of the cell signal line, non-linear capacitors are employed to provide automatic selective coupling of the respective signal line to a detector for determination of the cell state. By connecting a plurality of signal lines to a detector through respective non-linear capacitors that assume a significantly enlarged capacitance when the precharge voltage level is asserted, enhanced coupling of the signal line may be achieved and by selectively precharging the signal line to be interrogated, no triggering of enlarged capacitance at other signal lines occurs to load the detection system.

In a preferred symmetrical configuration for use with a reference comparison type of detection, shifts in the discharge characteristics for the two comparison inputs to the cell state detector resulting from manufacturing variations tend to cancel, thus permitting more sensitive detection to be employed.

To complement the preferred configuration, a special reference circuit using a pair of joined signal lines provides a ramp signal having intermediate voltage values relative to the state-indicative signals produced by interrogated cells for the two respective cell states. By using a reference circuit that is located with and uses the same devices as the storage circuitry, any shifts in characteristics as a result of manufacturing variations have a greater tendency to cancel in the signal comparison.

11 Claims, 11 Drawing Figures

FIG. 7
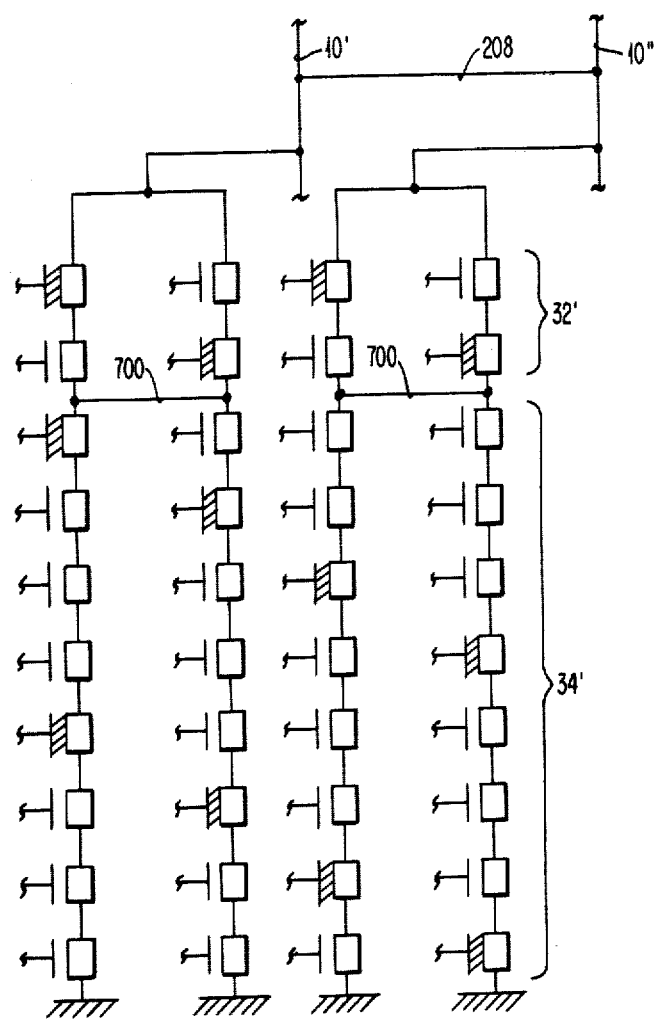
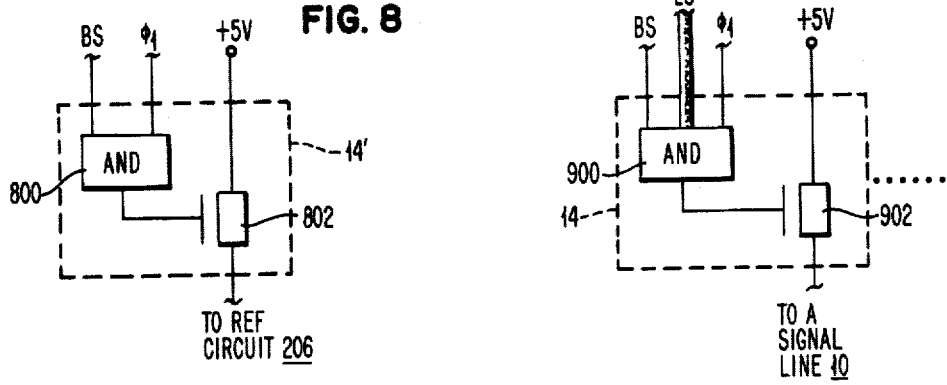
FIG. 8
FIG. 9

STATE DETECTION FOR STORAGE CELLS

BACKGROUND OF THE INVENTION

1. Field of the Invention

The present invention relates to signal storage devices in general and, in particular, to apparatus for use in interrogating individual cells of such devices.

2. Discussion Relative to the Art

It is well known to interrogate arrays having individual storage cells that influence a discharge path from a signal line by precharging the signal line and, in effect, detecting the rate at which the charge is drained. A particularly sensitive detection can be achieved by comparing the discharge for the signal line of the interrogated cell to a reference discharge; generally a discharge that occurs at a rate intermediate to the rates for the two possible states of an interrogated cell.

The cells may, for example, be a string of field effect transistor (FET) switches that form a series connection to ground from a signal line. All of the switches of the string, except the switch under interrogation, are forced to conduct and the gate electrode of the interrogated transistor cell is set to a level such that it will conduct if it is implanted to be a depletion mode device (one stored logic state) and will not conduct if implanted to be an enhancement mode device (the other logic state).

If plural signal lines are used, all lines are typically precharged and the particular signal line of the interrogated cell is switched to supply the state representative signal to a detector. And, if the above mentioned comparison detector is used, a reference signal is also supplied as an input to the detector.

Some problems of the usual configuration relate to the amount of space consumed for switching respective signal lines and the timing requirements for such switching. Also, manufacturing variations for the reference and cell circuits require a greater discharge to occur than is desirable before a reliable detection can be achieved.

SUMMARY OF THE INVENTION

By coupling plural signal lines of a storage device to a state detector through respective non-linear capacitors, automatic switching of the signal line of an interrogated cell may be achieved and with selective signal line precharging, such coupling may be achieved without incurring the penalty of a high capacitive loading at the common detector terminal. The capacitors are preferably of the inversion-layer type and are connected to change to a low capacitance value from a relatively high capacitance value when the detector terminal is precharged while the signal line terminal remains at ground potential. A precharge is applied specifically to the signal line of the selected cell and establishes an electric field condition that results in a high capacitance characteristic for the non-linear capacitor of the selected signal line.

Such signal switching, it should be appreciated, might also be used for multiplexing signals representing information other than stored logic states. Indeed, selective control of bias potentials for a set of such non-linear capacitors could be used to cause switching of various alternating or pulsed signals.

Preferably, for storage cell interrogation, a comparison type of detector is used in conjunction with two banks of sense lines and a reference circuit is incorporated in each bank. The reference circuits provide a voltage waveform that is intermediate to those waveforms produced for the two respective cell states. A connection to a respective terminal of the detector is preferably provided for each bank of sense lines using the capacitive switching described above. When interrogating a cell located in one bank, the reference circuit of the other bank is precharged to be coupled, by capacitor switching to the detector to provide the comparison waveform. By so arranging respective reference circuits, a symmetry is achieved in the layout of the overall circuit which, as a result of comparison-type detection, enhances the cancellation of performance variations that can arise from variations in manufacturing.

A presently preferred reference circuit for implementing the invention utilizes two signal lines that are shorted together (connected by a conducting path). Normal storage cell connections are created for the shorted lines so that the combined lines exhibit a double capacitance compared to the normal signal lines. By so creating a reference circuit with double capacitance, a discharge waveform intermediate that for the normal cells is achieved that tends to track the storage signal line discharge rate faithfully, even in the face of manufacturing variations, because the reference circuit includes the same basic components that the storage circuits include. It should be noted, moreover, that the special reference circuit is not limited to use with the non-linear capacitive coupling described above and could, for example, be used with the selective transistor switching of signal lines to a detector that is known in the art.

While the preferred implementation of the invention is described for a read only storage (ROS), it will be appreciated that the same operating philosophy could be employed with a read/write storage (RAM) as well.

A presently preferred implementation for the invention will now be described in detail with reference to the drawings wherein:

FIG. 7 is a diagram in block form indicating storage cell strings for a reference circuit in accordance with an aspect of the invention;

FIG. 8 is a diagrammatic representation of a decode and precharge circuit for a reference circuit according to the invention;

FIG. 9 is a diagrammatic representation of a decode and precharge circuit for a signal line;

Figure 1:
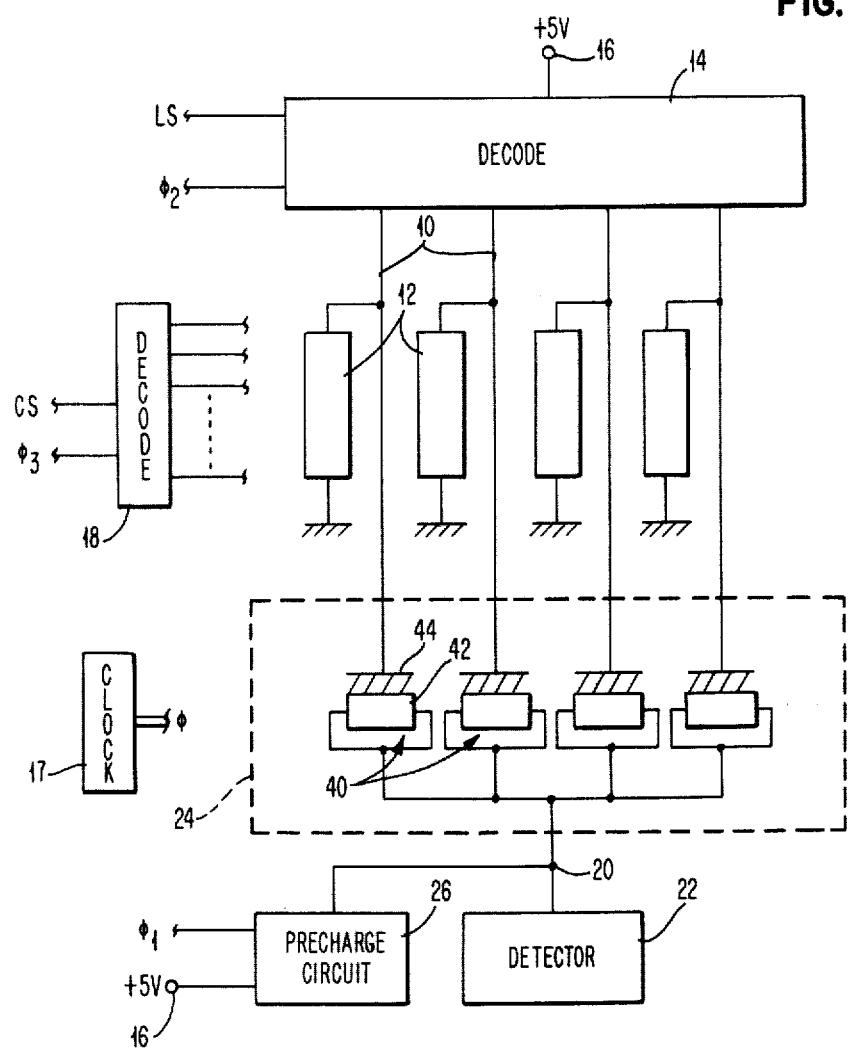
FIG. 1 is a diagram in block form indicating a connection of signal lines to a detector using non-linear capacitors for signal coupling in accordance with one aspect of the invention.

Referring to FIG. 1, a storage device includes plurality of signal lines 10 that are individually connected to ground by storage cell clusters 12. Decoding and precharge means 14 selectively supplies a precharge voltage from a source 16 to the lines 10 in accordance with a signal line select signal LS. A strobe signal $\phi_2$, produced by a clock circuit 17 as is known in the art, is provided to time the application of the precharge voltage and such operation could be performed by known decoder circuits having enable control or using apparatus that will be described below.

Figure 2:
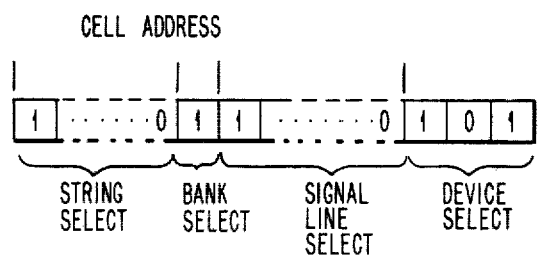
FIG. 2 is a representation of a coded address for identifying a storage cell.

The signal line selection address would typically be a portion of an overall cell address as indicated in FIG. 2. Selection of individual cells within a string is performed by a decoder 18 based on string and device select signals CS, as is discussed more fully below.

Information signals on signal lines 10 are switched onto a receiving terminal 20 of a detector 22 by a multiplexer 24.

Figure 3:
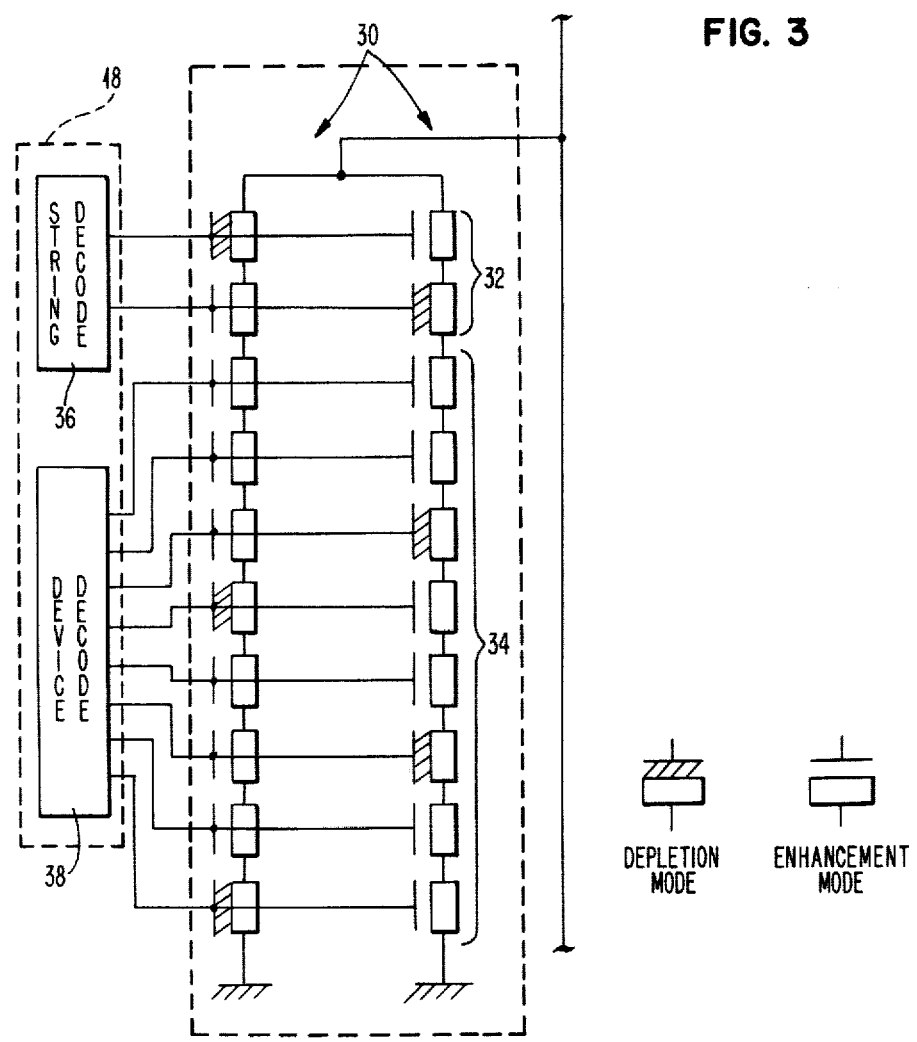
FIG. 3 is a diagram in block form indicating two series strings of transistors that act as storage cells.

Referring to FIG. 3, one known arrangement for a storage cell cluster 12 provides parallel strings 30 including string select transistors 32 and storage cell transistors 34. For this arrangement of storage cells, the decoder 18 may be considered to include a string decode section 36 and a device decode section 38. Signals for switching of the string select transistors 32 for a particular string to all conduct are produced by section 36 when the corresponding string code representation occurs in the cell address (see FIG. 2).

Digital information is stored in a cell 34 during manufacturing by selectively implanting an FET device as either depletion (denoted in FIG. 3 by crosshatching) or enhancement mode as is known in the art. Depletion mode devices conduct for relative gate voltages that are lower (e.g. −2 volts) than enhancement mode devices (e.g. +1 volt). (As was mentioned above, the invention will be described in detail with reference to a ROS environment but may be used with a read/write storage or other signal producing device.)

A particular cell is isolated for interrogation when, in addition to the string selection mentioned above, the device decoder section 38 receives the device select code (see FIG. 2) corresponding to the cell. The device decoder section 38 raises the gate voltages all of the cells to five volts except those corresponding to the selected device code which are held at zero volts. Such operation is obtained, for example, using the inverted outputs of a standard decoder circuit. If the selected device (based on line string and device codes) is personalized as an enhancement device, a zero volt gate level does not trigger the device to conduct and, consequently, only leakage discharge of the precharge signal line occurs. If, on the other hand, the device is personalized as a depletion device, the zero volt gate level does trigger the device to conduct and a discharge does occur.

For purposes of simplicity, the device decoder section 38 provides the same control signals to all strings 30, even those that are not selected, however, the string select transistors 32 block current for all but the selected string 30 and the signal line selection according to the invention precharges only the signal line of the selected cell.

Figure 4:
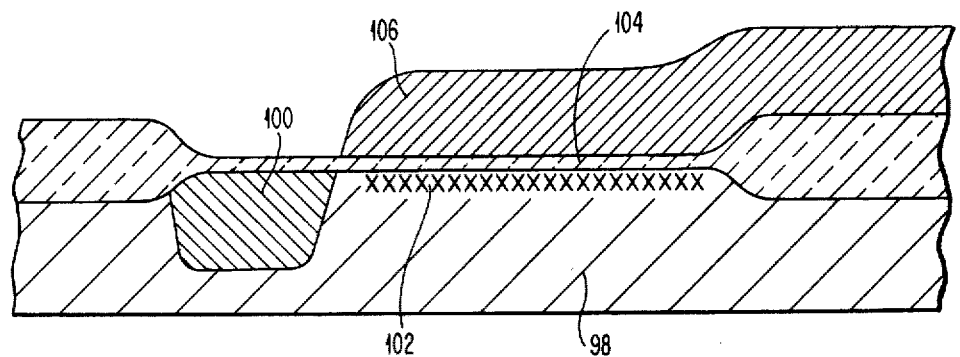
FIG. 4 is a cross-sectional view of a depletion implanted capacitor of the type having characteristics suitable for implementation of apparatus according to the invention.

In accordance with the invention, the multiplexer 24 comprises a set of non-linear capacitors 40 that are connected between respective signal lines 10 and the terminal 20 of detector 22. Preferably, these capacitors are formed as inversion layer capacitors having a structure generally as indicated in FIG. 4. While such capacitors are known in the art, a brief explanation of the mechanism by which they operate will be provided.

On a substrate of monocrystalline P-type silicon 98, a source-drain electrode 100 is formed by a high level arsenic ion implantation that results in a relatively high electrical conductivity. Area 102, that is denoted with X's, receives a relatively light arsenic ion implant and is the site of an inversion layer or sheet of charge that occurs for certain electric field conditions, which will be discussed below, and acts as one plate of the capacitor. A thin layer 104 of insulating silicon dioxide is formed over the electrode 100 and area 102. A gate electrode 106 that serves as the second plate of the capacitor is then formed over the area 102, for example, using polycrystalline silicon that acts as a conductor.

Figure 5:
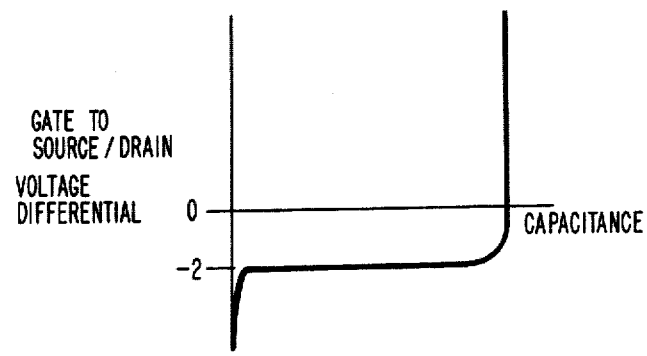
FIG. 5 is a diagram indicating the non-linear capacitance characteristic that is exploited according to one aspect of the invention.

As is apparent from FIG. 5, the inversion layer of charge that acts as one plate of the capacitor tends to form only for certain electric field conditions and, typically, the capacitance of the device shifts markedly at a gate-to-source/drain voltage of around minus two volts.

The proper conditions for selective capacitive switching of the signal lines are achieved, in part, by precharging the detector terminal 20 to five volts using precharge means 26, such means 26 may, for example, be a switching transistor (not shown) that is connected to source 16 and is controlled by a strobe signal $\phi_1$ which times the precharge period. With the terminal 20 precharged to five volts, the capacitors 40 for the unselected signal lines 10 are subjected to a minus five volt gate-to source/drain differential and assume the low capacitance state. The capacitor 40 for a selected signal line, however, sees a zero volt gate-to-source/drain differential and assumes the high capacitance state (see FIG. 5) which provides a strong coupling effect. The terminal 20, once a cell interrogation begins (see description above), tends to follow the discharge of the selected signal line and the detector 22 determines the cell state from the discharge waveform, e.g. from the voltage level after a fixed discharge period.

Figure 6:
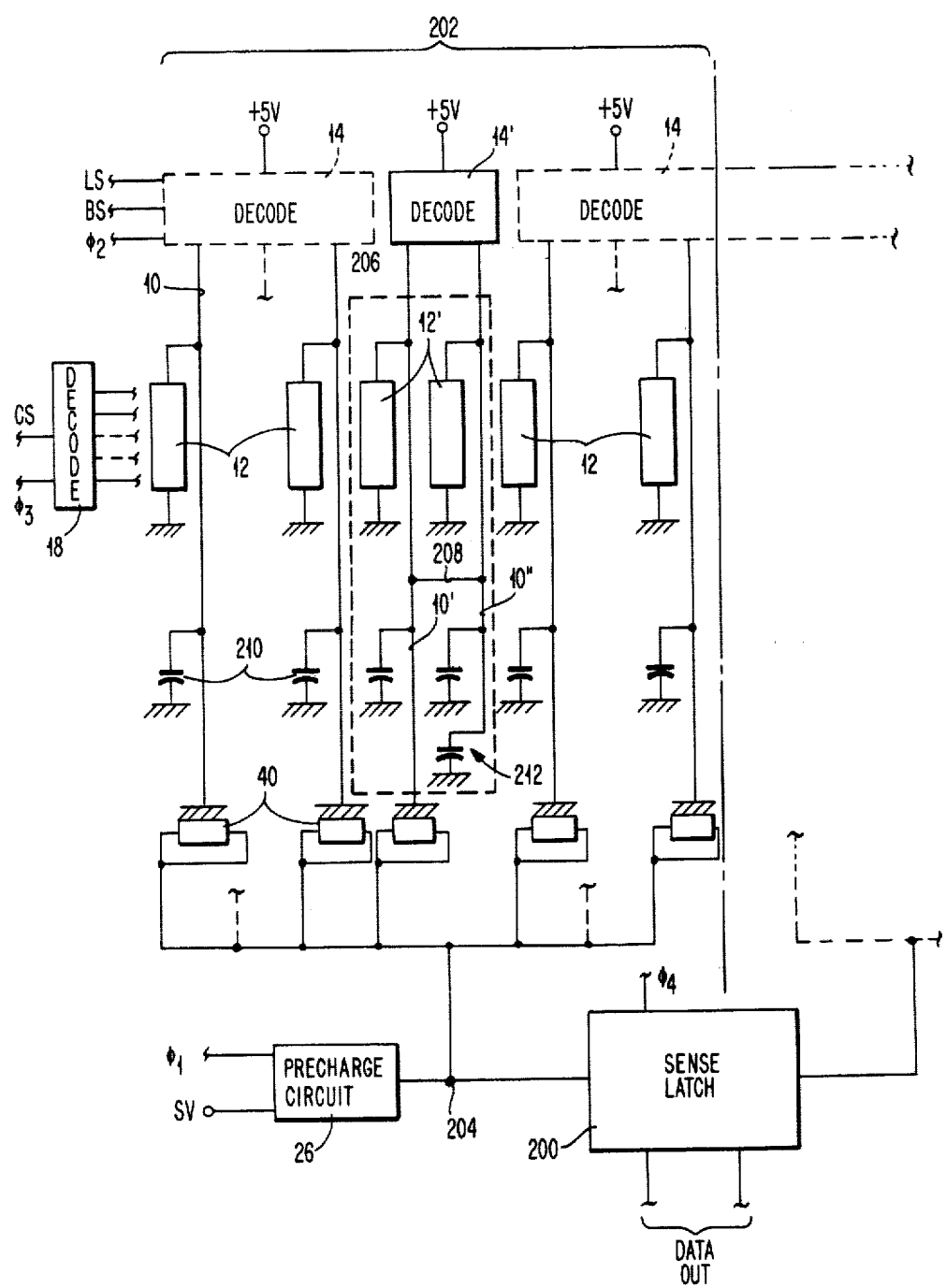
FIG. 6 is a diagram in block form of a presently preferred storage cell layout that, according to one aspect of the invention, provides a desirable symmetry for comparison-type cell state detection.

Now referring to FIG. 6, a presently preferred storage device is described having symmetrically arranged storage cells that cooperate with a comparison type of sense latch 200. Such latches are well known and rely on a comparison to a reference waveform for detecting the logic state represented by a signal. Symmetry according to an aspect of the invention is achieved by arranging the storage lines into separate banks, such as the bank 202, that have respective terminals (e.g. terminal 204) for sending signals to the sense latch 200. For the preferred two bank arrangement, each bank 202 has a respective reference circuit 206 which is coupled to the detector terminal 204 associated with the bank. Coupling of the storage signal lines 10 and of the reference circuit 206 to the detector terminal 204 is preferably effected using inversion layer capacitors 40 as was discussed above.

According to a further aspect of the invention, a reference circuit 206 is produced by joining two signal lines 10' and 10" with a conducting path such as a path 208. (Primes are used to indicate elements that are essentially similar but have been adapted to the special function of producing a reference waveform). The capacitance 210 associated with a signal line is shown as a lumped capacitance (unlike FIG. 1) to dramatize the paralleling of capacitance that occurs when path 208 is added. Also, a special tuning capacitance 212 is indicated, which is formed as a discrete element (e.g. a depletion mode inversion capacitor) to adjust the discharge rate of the circuit 206. The reference circuit signal lines 10' have cell clusters 12' similar to those of the signal lines 10 but are personalized so that, for any given cell address, one discharge path to ground exists for the overall reference circuit 206.

Referring to FIG. 7, a personalization for a cluster 12' is indicated which utilizes connections 700 between the strings for each respective line at a position between the string selection transistors 32 and the storage transistors 34. Depletion transistors are staggered among the cell positions along the strings so that only one depletion transistor occurs for each cell position. With this arrangement, only one path to ground is provided for the overall reference circuit 26 for any given cell interrogation, thereby achieving the desired result of a double capacitance relative to a storage signal line while providing only a single discharge path. The effect of this relationship of parameters to those of a storage signal line is to double the discharge time constant and provide a reference waveform for discharge that is intermediate of the discharge waveforms for the two possible cell storage states resulting from cell interrogation.

Decoding and precharging means suitable for use in implementing the invention is indicated in FIGS. 8 and 9. The means 14' in FIG. 8 includes an AND gate 800. The state of signal BS and timing signal $\phi_1$ control the occasions when a transistor 802 is conducting to supply precharge current from the source 16. An inverting input terminal of gate 800 would be used to precharge the reference circuit 206 for the other bank 202. The logic for precharging the reference circuits for the storage configuration of FIG. 6 must precharge the reference circuit for the bank 202 that is not selected, i.e. if a cell in a first bank 202 is selected, then the reference circuit 206 of the second bank is precharged.

To precharge the signal line according to the invention, a selective precharge is required. As indicated in FIG. 9, both the line select (LS) and bank select (BS) signals must be decoded. An AND gate 900 with input inverting capability may be provided for each signal line (the means 14 would have one gate 900 for each line 10). Input inversions are necessary to program each respective gate 900 of means 14 to produce an output only for a corresponding line selection identification when the identifying signal occurs in coincidence with a timing signal $\phi_2$. The timing signal $\phi_2$ serves to control the precharge period. Such use of AND gates to produce an output for only a specific coded signal input is, of course, well known. Again, a transistor 902 is indicated to control current from the source 16. If AND gates 800 and 900 with output at precharge voltage levels (e.g. five volts) are used, transistors 802 and 902 may be eliminated.

Figure 10:
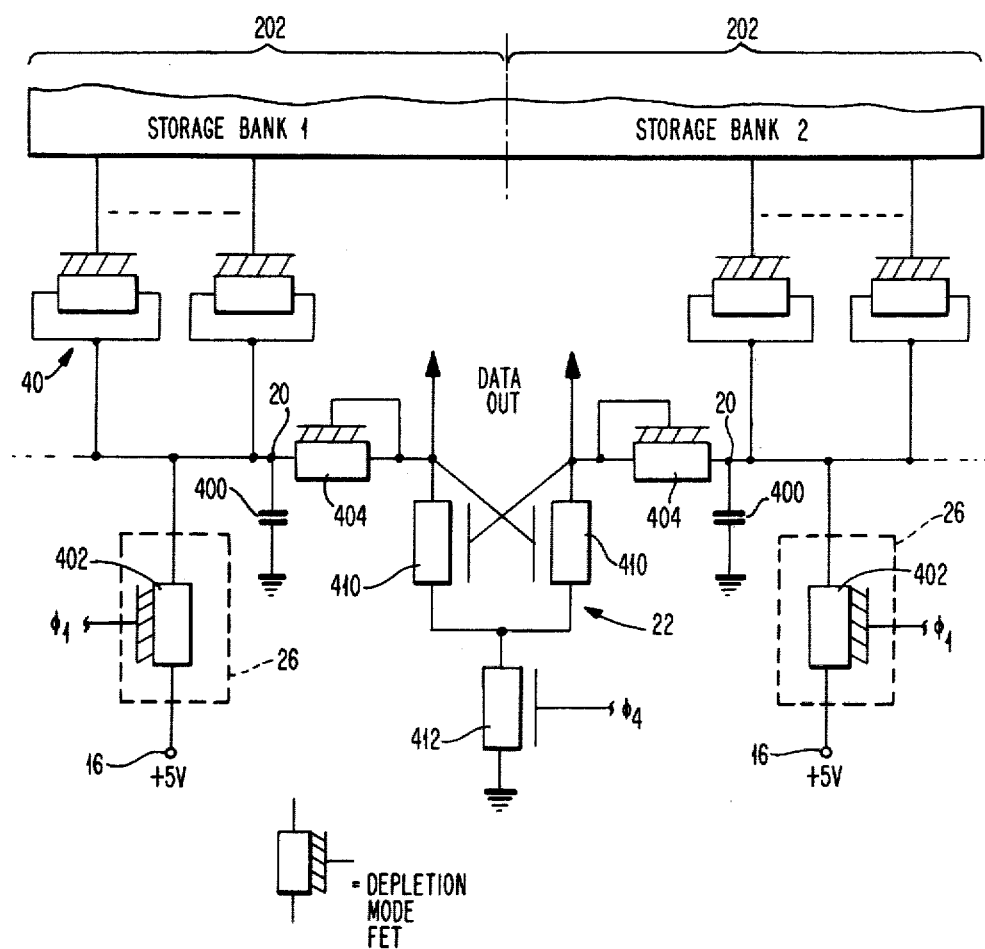
FIG. 10 is a diagram in block form indicating details of a simple sense latch for use with the layout of FIG. 5.

Referring to FIG. 10, the symmetrical arrangement of the storage banks 200 is indicated with coupling through non-linear capacitors 40 to a single comparison-type detector or sense latch 22.

Precharging of capacitance 400 at nodes 20 is provided by a precharge means 26 which may, for example, be the transistors 402 that are connected to the five volt supply 16 and are responsive to a timing signal $\phi_1$. With precharge completed, the comparison-type detector 22 is in a balanced condition and the inversion layer capacitors 40 are biased to the low capacitance state (see FIG. 5).

Signal line selection by the decoders 14 causes the signal line identified by the cell address (both line select LS and bank select BS are needed for identification) to be precharged to five volts and the decoders 14' cause the reference circuit 206 for the storage bank 202 that is not selected to also be precharged to five volts. Timing for the line precharging is controlled by timing signal $\phi_2$.

This selective precharging triggers the capacitors 40, in the lines that are precharged, to the high capacitance and attendantly the high coupling state (see FIG. 5). With the lines precharged, the timing signal $\phi_3$ causes cell interrogation which, as discussed above, results in the creation or absence of a discharge path to ground in accordance with the personalization of the selected cell.

The resulting waveform is coupled through capacitor 40 of the selected line to terminal 20 of the selected bank 202. At the same time, the reference circuit 206 (of the unselected bank 202) which is triggered to cause a line discharge by the decoder 18 produces a signal which is coupled through the corresponding capacitor 40 to the other terminal 20 of the comparison-type detector 22.

A pair of transistors 404 act as switches controlling the flow of charge to the gates of a pair of cross-coupled transistors 410 which "race" to turn each other off, as is well known in the art. When sufficient line discharge has occurred to define the cell state, a timing signal $\phi_4$ switches a transistor 412 which connects one terminal of the transistors 410 to ground and, in effect, latches the detection result. For further description regarding latch circuits of this general type, see U.S. Pat. No. 4,053,873.

Figure 11:
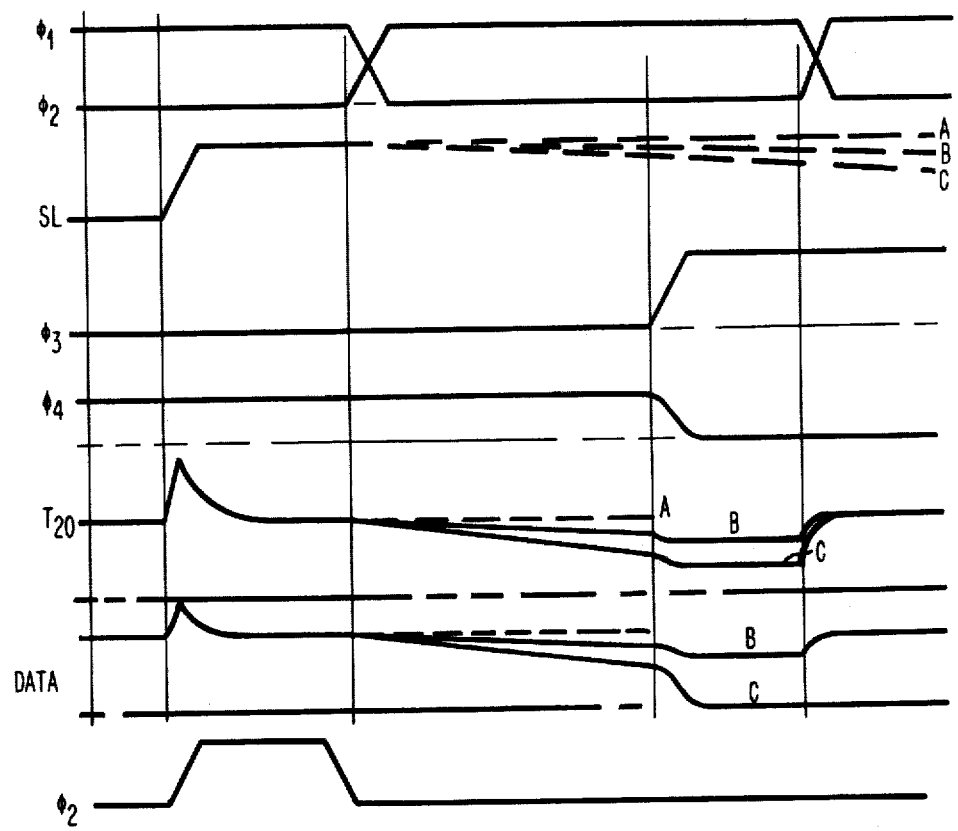
FIG. 11 is a diagrammatic representation of voltage waveforms for various circuit modes in FIGS. 5 and 6.

Waveforms at various locations for the circuits of FIGS. 6 and 10 are indicated in FIG. 11. The signal SL is the voltage level of a selected signal line indicating the precharge and discharge resulting from cell selection (A denotes enhancement mode personalization and hence no discharge; B denotes the reference circuit discharge; and C denotes the depletion mode personalization). Signal $T_{20}$ is the waveform at the terminal 20 and includes an initial transient, as the selected line and reference are precharged, and then reflects the nature of the discharge that occurs when the selected cell is interrogated. The signal labeled DATA is the output of the detector 22 and indicates a situation where the reference (see signal B) and a depletion personalized cell (see signal C) create the detector inputs. After an initial transient, the two transistors 410 race to choke each other to the "off" state. The reference side succeeds when opposing a signal produced by a depletion personalized cell which causes the fastest discharge.

The signals $\phi_1$, $\phi_2$, $\phi_3$, and $\phi_4$ are timing signals as was discussed above and serve to time the precharge periods ($\phi_1$ and $\phi_2$), the cell interrogation ($\phi_3$) and data signal latching ($\phi_4$). These signals may be produced by various known timing signal or clock circuits as was mentioned above.

The invention in its various aspects has been described in detail with reference to a presently preferred implementation. However, it will be appreciated that variations and modifications within the scope of the invention will be suggested to those skilled in the art. For example, devices other than a read only storage might utilize the invention to selectively switch signals.

Also, the reference circuit using storage line devices would function satisfactorily in a storage system that uses transistors to selectively switch signals rather than non-linear capacitors.

What is claimed is:

1. A binary signal storage device responsive to a cell identifier signal, said device comprising:

a first and a second bank of individual storage signal lines which exhibit an effective capacitance and have storage cells connected thereto that are individually selectable to control the conducting state of a discharge path for a respective signal line in accordance with a preconditioning of said cells, a comparison-type detector having first and second terminals for receiving inputs, multiplexer means responsive to said identifier signal for selectively coupling the signal line corresponding to an identified cell to an input terminal of said detector, which multiplexer means couples signal lines from said first bank to said first detector terminal and signals from said second bank to said second detector terminal, a first reference waveform circuit associated with said first bank and consisting of a pair of signal lines that are connected through a conducting link to exhibit paralleled capacitance and are connected to discharge through a network of preconditioned storage cells, a second reference waveform circuit associated with said second bank and consisting of a pair of signal lines that are connected through a conducting link to exhibit a paralleled capacitance and are connected to a discharge network of preconditioned storage cells, said multiplexer means further including means for identifying the reference circuit associated with the bank that does not include the identified cell and means for coupling the identified reference circuit to the corresponding detector input terminal, whereby a comparison of waveforms for the signal line of the identified cell and for a reference circuit may be effected.

2. A device according to claim 1 wherein said multiplexing means includes non-linear capacitors that exhibit a relatively high capacitance for a first range of potential differences there across and a relatively low capacitance for a second range of potential differences thereacross, said capacitors connecting said individual signal lines and reference circuits to the detector terminal for the corresponding bank, and selective precharging means responsive to said identifier signal for establishing a potential difference in said first range for the identified signal line and the identified reference circuit to said detector terminals while establishing a potential difference in said second range for capacitors associated with other signal lines and the other reference circuit, whereby enhanced signal coupling is achieved for the identified signal line and reference circuit.

3. A device according to claim 1 wherein said signal lines for each bank are parallel and the signal lines that are connected to provide a reference circuit are located centrally to their respective bank.

4. A signal switching device for selectively coupling signals between a junction terminal and one signal line of a set of signal lines that is identified by a coded signal, said device comprising:

non-linear capacitors connected between respective signal lines of said set and said junction terminal, said capacitors being characterized by a relatively high capacitance for a first range of potential differences thereacross and by a relatively low capacitance for a second range of potential differences thereacross, means responsive to said coded signal for producing a potential difference in said second range across capacitors associated with signal lines of said set that are not identified by said coded signal, and means responsive to said coded signal for producing a potential difference in said first range across the capacitance of the line identified by said coded signal, whereby selectively enhanced coupling between said identified line and said junction terminal is achieved.

5. A signal switching device according to claim 4 wherein said capacitors are depletion implanted capacitors formed on a silicon substrate, which capacitors exhibit a sharp transition from a relatively low capacitance at potential differences thereacross ranging below a threshold value and a relatively high capacitance at voltages ranging above said threshold value.

6. A reference waveform circuit for a storage unit of the type that has plural signal lines which exhibit an effective capacitance and are connected to storage cells that are conditioned to either of two states and are selectable to control a discharge path for the signal line associated therewith to be either conducting or nonconducting, which storage unit includes a detector that compares discharge waveforms applied at respective of two input terminals during cell interrogation operations, said reference waveform circuit comprising:

a pair of signal lines;

means for charging said pair of signal lines to a predetermined voltage level as an incident to cell interrogation operation, a connecting path that electrically connects said pair of signal lines to permit electrical charge transfers therebetween;

means for coupling said pair of signal lines to one of said input terminals of said detector at least during a part of a cell interrogation operation, and having a network of storage cells connected thereto that are connected to define at least one discharge path for said signal line pair;

means, cooperating with said network of cells, for enabling one and only one of said discharge path(s) for said signal line pair to conduct during a cell interrogation, whereby a discharge waveform exhibiting a relatively long time constant is produced.

7. A reference waveform circuit according to claim 6 wherein the storage cells associated with said pair of signal lines are connected in strings that may serve as discharge paths, the conducting state of a cell string being related to the preconditioning of the cell at a selected string position with said cells being preconditioned in a staggered pattern among the strings associated with said signal line pair to provide only one cell for completing a conducting discharge path for each selectable string position.

8. A reference waveform circuit according to claim 7 wherein said storage cells are field effect transistors and the preconditioning involves ion implantation to cause a respective transistor to operate in a preselected mode.

9. A reference waveform circuit according to claim 7 wherein a discrete tuning capacitance is connected to a signal line of said connected pair to adjust the overall capacitance of said pair to be substantially twice that of the capacitance for a single signal line.

10. Selective signal coupling apparatus for use with a storage device of the type that receives a cell identifies signal and includes (1) signal lines formed on a substrate, each of which exhibits an effective capacitance and is connected to at least one discharge path which includes storage cells that are selectable to control the conducting state of a respective path in accordance with a preconditioned state of the selected cell, and (2) a detector that has at least one input terminal, said apparatus comprising:

a set of non-linear capacitors connected between respective signal lines and said input terminal, said capacitors being characterized by a relatively high capacitance for a first range of potential difference thereacross and a relatively low capacitance for a second range of potential difference thereacross, first precharging means for precharging the input terminal of said detector to a first predefined voltage level, second precharging means for selectively establishing voltages on said signal lines, said second precharging means including means for decoding said cell identifier signal to identify the signal line corresponding to the identified cell, means for applying a second precharge voltage to the identified line, at a voltage level relative to said first predefined voltage, that establishes a potential difference across the respective capacitor that is in said first range, and means for applying a third precharge voltage to the signal lines other than the identified line, at a voltage level relative to said first predefined voltage that establishes a potential difference across the respective capacitors that is in said second voltage range, whereby selective signal coupling is effected.

11. Selective signal coupling apparatus according to claim 10 wherein said non-linear capacitors are depletion implanted field-effect capacitors.

* * * * *